(12) United States Patent
Lee et al.

(10) Patent No.: US 10,262,937 B2
(45) Date of Patent: Apr. 16, 2019

(54) INTEGRATED CIRCUIT DEVICE

(71) Applicant: SAMSUNG ELECTRONICS CO., LTD., Suwon-si, Gyeonggi-do (KR)

(72) Inventors: Joon-gon Lee, Seoul (KR); Ryuji Tomita, Yongin-si (KR); Do-Sun Lee, Suwon-si (KR); Chul-sung Kim, Seongnam-si (KR); Do-hyun Lee, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/679,444

(22) Filed: Aug. 17, 2017

(65) Prior Publication Data

US 2018/0261540 A1   Sep. 13, 2018

(30) Foreign Application Priority Data

Mar. 9, 2017   (KR) .................. 10-2017-0030269

(51) Int. Cl.
*H01L 23/522*   (2006.01)
*H01L 29/78*   (2006.01)
*H01L 23/532*   (2006.01)
*H01L 21/768*   (2006.01)

(52) U.S. Cl.
CPC .... *H01L 23/5226* (2013.01); *H01L 21/76802* (2013.01); *H01L 21/76843* (2013.01); *H01L 23/53204* (2013.01); *H01L 29/785* (2013.01)

(58) Field of Classification Search
CPC ........... H01L 23/5226; H01L 21/76802; H01L 21/76843; H01L 23/53204; H01L 29/785
See application file for complete search history.

(56) References Cited

U.S. PATENT DOCUMENTS

| | | | |
|---|---|---|---|
| 7,282,444 B2 | 10/2007 | Tanida et al. | |
| 9,196,545 B2 | 11/2015 | Chen et al. | |
| 2001/0045571 A1 | 11/2001 | Gandhi et al. | |
| 2007/0132009 A1* | 6/2007 | Takeuchi | H01L 21/845 257/321 |
| 2011/0294292 A1 | 12/2011 | Adetutu et al. | |
| 2013/0258759 A1 | 10/2013 | Liaw | |
| 2014/0197494 A1 | 7/2014 | Schultz | |
| 2014/0302660 A1 | 10/2014 | Liu et al. | |
| 2014/0332884 A1 | 11/2014 | Zhang et al. | |
| 2015/0179579 A1* | 6/2015 | Jezewski | H01L 21/76846 257/753 |

(Continued)

FOREIGN PATENT DOCUMENTS

JP   2005-167093 A   6/2005

*Primary Examiner* — Feifei Yeung Lopez
(74) *Attorney, Agent, or Firm* — Lee & Morse P.C.

(57) ABSTRACT

An integrated circuit device includes at least one fin-type active region, a gate line on the at least one fin-type active region, and a source/drain region on the at least one fin-type active region at at least one side of the gate line. A first conductive plug is connected to the source/drain region and includes cobalt. A second conductive plug is connected to the gate line and spaced apart from the first conductive plug. A third conductive plug is connected to each of the first conductive plug and the second conductive plug. The third conductive plug electrically connects the first conductive plug and the second conductive plug.

15 Claims, 10 Drawing Sheets

(56) References Cited

U.S. PATENT DOCUMENTS

2016/0111430 A1* 4/2016 Liaw .................. H01L 27/1104
　　　　　　　　　　　　　　　　　　　257/384
2016/0141291 A1　　5/2016 Woo et al.
2016/0322503 A1* 11/2016 Tezuka ................ H01L 29/7869
2016/0351975 A1* 12/2016 Momo .............. H01M 10/0562
2016/0380100 A1* 12/2016 Bryant ................ H01L 21/845
　　　　　　　　　　　　　　　　　　　257/348

* cited by examiner

INTEGRATED CIRCUIT DEVICE

CROSS-REFERENCE TO RELATED APPLICATION

Korean Patent Application No. 10-2017-0030269, filed on Mar. 9, 2017, and entitled, "Integrated Circuit Device," is incorporated by reference herein in its entirety.

BACKGROUND

1. Field

One or more embodiments described herein relate to an integrated circuit device.

2. Description of the Related Art

Down-scaling continues to be a goal of integrated circuit designers. One approach to down-scaling involves reducing the widths and pitches of metal interconnection lines. However, this may cause physical and/or chemical damage to the interconnection structure (e.g., metal interconnection lines). As a result, the durability and reliability of the integrated circuit device is adversely affected.

SUMMARY

In accordance with one or more embodiments, an integrated circuit device includes a substrate including at least one fin-type active region extending in a first direction; a gate line on the at least one fin-type active region and extending in a second direction crossing the first direction; a source/drain region on the at least one fin-type active region at at least one side of the gate line; a first conductive plug connected to the source/drain region and including cobalt; a second conductive plug connected to the gate line, the second conductive plug spaced apart from the first conductive plug; and a third conductive plug connected to each of the first conductive plug and the second conductive plug, the third conductive plug electrically connecting the first conductive plug and the second conductive plug.

In accordance with one or more other embodiments, an integrated circuit device includes a substrate including at least one fin-type active region; a plurality of gate lines extending across the at least one fin-type active region; a plurality of source/drain regions on the at least one fin-type active region at opposite sides of the plurality of gate lines; a first contact structure including a first conductive plug connected to at least one of the plurality of source/drain regions between adjacent ones of the plurality of gate lines and a second conductive plug connected to one of the adjacent ones of the plurality of gate lines; and a second contact structure on the first contact structure and including a third conductive plug on an upper surface of the first conductive plug and on an upper surface of the second conductive plug to connect the first conductive plug and the second conductive plug.

In accordance with one or more other embodiments, a device includes a first contact; a second contact; and a third contact overlapping the first and second contacts, wherein the first contact is a gate contact of a first size, the second contact is a source/drain contact of a second size greater than the first size, and the third contact is electrically connected to the first and second contacts, the third contact in a contact hole that extends to an upper surface of the source/drain contact.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
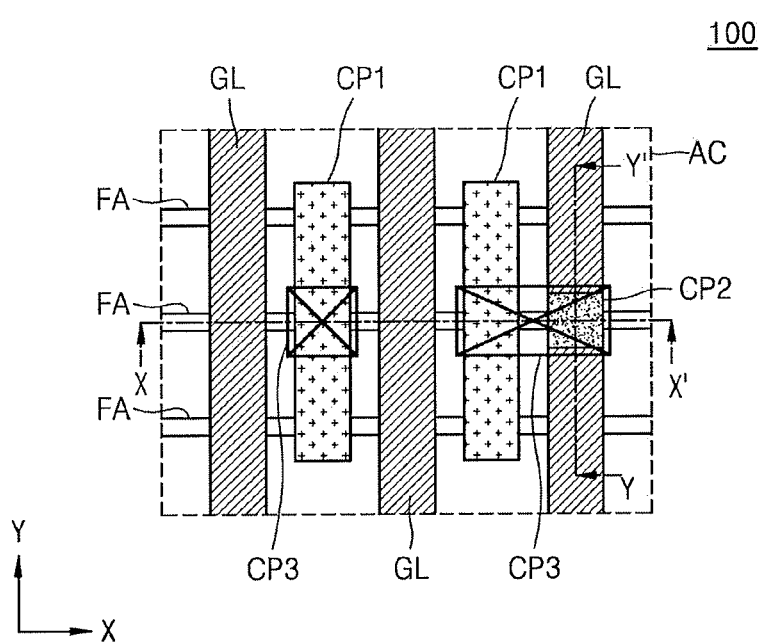
FIG. 1 illustrates a layout embodiment of an integrated circuit device.
Figure 2A:
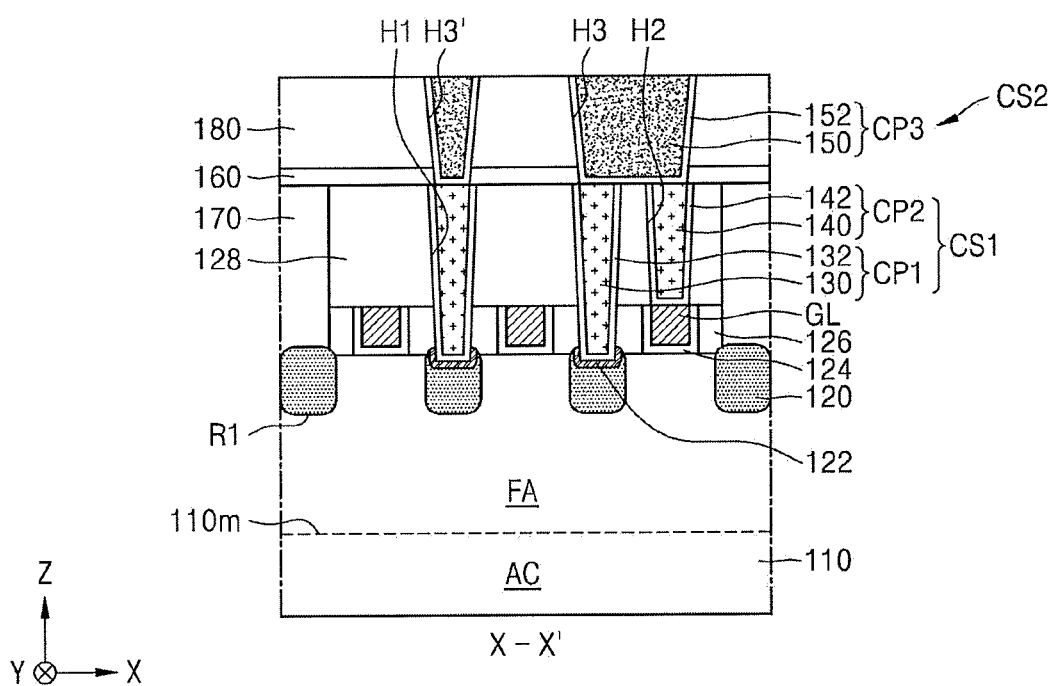
FIG. 2A illustrates a cross-sectional view taken along line X-X' in FIG. 1.
Figure 2B:
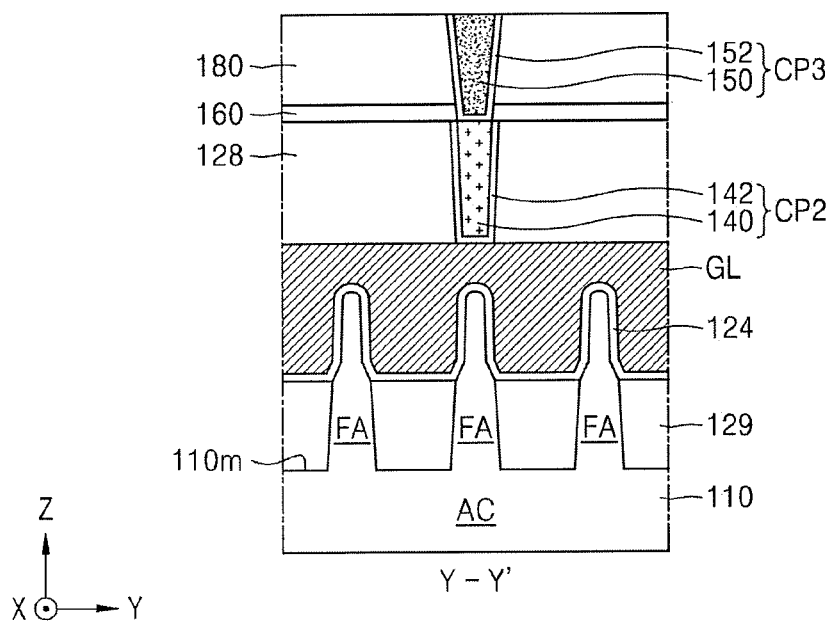
FIG. 2B illustrates a cross-sectional view taken along line Y-Y' in FIG. 1.

FIG. 1 illustrates a layout embodiment of an integrated circuit device 100. FIG. 2A illustrates a cross-sectional view taken along line X-X' in FIG. 1. FIG. 2B illustrates a cross-sectional view taken along line Y-Y' in FIG. 1.

Referring to FIGS. 1, 2A, and 2B, the integrated circuit device 100 may include a substrate 110 having a main surface 110m extending in a horizontal direction (e.g., X and Y directions). The substrate 110 may include a device active region AC which may include a plurality of fin-type active regions FA. The fin-type active regions FA may protrude from the substrate 110 in the device active region AC. The fin-type active regions FA may extend parallel to each other in the X direction. An isolation insulating layer 129 may be between each of the fin-type active regions FA on the device active region AC. The fin-type active regions FA may protrude above the isolation insulating layer 129 to have a fin shape.

In some embodiments, the substrate 110 may include a semiconductor material such as Si or Ge, or a compound semiconductor material such as SiGe, SiC, GaAs or InP. The substrate 110 may include a conductive region, for example, an impurity-doped well or impurity-doped structure.

A plurality of gate insulating layers 124 and a plurality of gate lines GL may be on the substrate 110. The gate insulating layers 124 and the gate lines GL may extend in the Y direction and may cross the fin-type active regions FA. The gate insulating layers 124 and the gate lines GL may extend to cover upper surfaces and sidewalls of the fin-type active regions FA and the upper surface of isolation insulating layer 129.

A plurality of metal oxide semiconductor (MOS) transistors may be formed on the device active region AC along the gate lines GL. Each of the MOS transistors may be a three-dimensional MOS transistor having a channel on the upper surface and opposite sidewalls of each of the fin-type active regions FA.

Each of the gate insulating layers 124 may include oxide, a high-k dielectric material, or a combination thereof. The high-k dielectric material may include a material having a dielectric constant higher than that of oxide. For example, the high-k dielectric material may have a dielectric constant ranging from about 10 to about 25. The high-k dielectric material may include metal oxide or metal oxynitride. For example, the high-k dielectric material may include hafnium oxide, hafnium oxynitride, hafnium silicate, lanthanum oxide, lanthanum aluminum oxide, zirconium oxide, zirconium silicate, tantalum oxide, titanium oxide, or a combination thereof. In some embodiments, an interfacial layer may be between each of the gate insulating layers 124 and each of the fin-type active regions FA. The interfacial layer may include an insulating material such as oxide, nitride, or oxynitride.

Each of the gate lines GL may include a work function metal containing layer and a gap fill metal layer. The work function metal containing layer may include at least one of Ti, W, Ru, Nb, Mo, Hf, Ni, Co, Pt, Yb, Tb, Dy, Er, and Pd. The gap fill metal layer may include W or Al. In some embodiments, each of the gate lines GL may include, for example, a stacked structure of TiAlC/TiN/W, a stacked structure of TiN/TaN/TiAlC/TiN/W, or a stacked structure of TiN/TaN/TiN/TiAlC/TiN/W.

An insulating spacer 126 may be on opposite sidewalls of each of the gate lines GL. The insulating spacer 126 may cover the opposite sidewalls of each of the gate lines GL. The insulating spacer 126 may extend along an extension direction (e.g., the Y direction) of the gate lines GL. The insulating spacer 126 may include, for example, silicon nitride, silicon carbonitrde, silicon oxycarbonitride, or a combination thereof. In some embodiments, the insulating spacer 126 may include a material having a dielectric constant smaller than that of silicon oxide, for example, silicon carbonitrde, silicon oxycarbonitride, or a combination thereof.

A gate insulating capping layer 128 may cover each of the gate lines GL. A first insulating layer 170 may be between the gate lines GL. The gate insulating capping layer 128 may cover an upper surface of each gate line GL and extend parallel to each gate lines GL. The gate insulating capping layer 128 may include, for example, silicon nitride. The first insulating layer 170 may include, for example, silicon oxide. In one embodiment, the first insulating layer 170 may include silicon oxide such as plasma enhanced oxide (PEOX), tetraethyl-orthosilicate (TEOS), boron TEOS (BTEOS), phosphorus TEOS (PTEOS), boron-phosphorus TEOS (BPTEOS), boro-silicate glass (BSG), phosphor-silicate glass (PSG), or boro-phospho-silicate glass (BPSG).

In some embodiments, the gate insulating capping layer 128 may vertically overlap each gate line GL and the insulating spacer 126. In some embodiments, the insulating spacer 126 may extend upwardly beyond the upper surface of each gate line GL, and the gate insulating capping layer 128 may be between two insulating spacers 126 to cover the upper surface of each gate line GL.

A plurality of source/drain regions 120 may be on the fin-type active regions FA at opposite sides of the gate lines GL. Each of the source/drain regions 120 may include a semiconductor epitaxial layer in each of a plurality of recess regions R1 in the fin-type active regions FA. Each of the source/drain regions 120 may include, for example, a silicon (Si) layer, a silicon carbide (SiC) layer, or a plurality of silicon germanium (SiGe) layers that is or are epitaxially grown. When transistors on the fin-type active regions are NMOS transistors, each of the source/drain regions 120 may include a Si epitaxial layer or a SiC epitaxial layer and may include N-type impurity. When transistors on the fin-type active regions are PMOS transistors, each of the source/drain regions 120 may include, for example, a SiGe epitaxial layer and may include P-type impurity. Some of the source/drain regions 120 may be at least partially covered by the first insulating layer 170.

The integrated circuit device 100 may include at least one first conductive plug (or source/drain contact) CP1 and at least a second conductive plug (or gate contact) CP2 on the fin-type active regions FA. The first conductive plug CP1 may be connected to at least one of the source/drain regions 120. The second conductive plug CP2 may be connected to at least one of the gate lines GL. The first conductive plug CP1 may serve as a source/drain contact, and the second conductive plug CP2 may serve as a gate contact.

In some embodiments, the first conductive plug CP1 and the second conductive plug CP2 may form a first contact structure CS1 having an upper surface at a substantially uniform level.

A plurality of the first conductive plugs CP1 may extend across the fin-type active regions FA. For example, as shown in FIG. 1, two first conductive plugs CP1 may cross three fin-type active regions FA in the Y direction.

The first conductive plug CP1 may be in a first contact hole H1, which penetrates the first insulating layer 170 and exposes some of the source/drain regions 120, so that the first conductive plug CP1 may be electrically connected to the some of the source/drain regions 120. The first conductive plug CP1 may contact the source/drain regions 120. In some embodiments, a metal silicide layer 122 may be between the first conductive plug CP1 and the source/drain region 120. The metal silicide layer 122 may include, for example, titanium silicide or tantalum silicide.

In some embodiments, an upper surface of the first conductive plug CP1 on the fin-type active regions FA may be higher than the upper surfaces of the gate lines GL relative to the main surface 110m of the substrate 110. The upper surface of the first conductive plug CP1 may be substantially coplanar with an upper surface of the gate insulating capping layer 128 around the first conductive plug CP1.

The first conductive plug CP1 may include a first metal layer 130 and a first conductive barrier layer 132 extending along or covering a sidewall and a lower surface of the first metal layer 130. In some embodiments, the first metal layer 130 may include Co, W, Cu, Ru, Mn, Ti, Ta, or a combination thereof. The first conductive barrier layer 132 may include, for example, Ti, TiN, Ta, TaN, or a combination thereof.

The second conductive plug CP2 may be in a second contact hole H2, which penetrates the gate insulating capping layer 128 and exposes at least one of the gate lines GL, so that the second conductive plug CP2 may contact the at least one of the gate lines GL. The second conductive plug CP2 may be electrically connected to at least one of the gate lines GL.

In some embodiments, an upper surface of the second conductive plug CP2 on the fin-type active regions FA may be substantially coplanar with the upper surface of the first conductive plug CP1. The upper surface of the second conductive plug CP2 may be substantially coplanar with the upper surface of the gate insulating capping layer 128 around the second conductive plug CP2.

The second conductive plug CP2 may be spaced apart from the first conductive plug CP1. For example, the second conductive plug CP2 may be insulated from the first conductive plug CP1 by the gate insulating capping layer 128. A sidewall of the second conductive plug CP2 and a sidewall of the first conductive plug CP1 may be covered by the gate insulating capping layer 128. As shown in FIG. 1, the first conductive plug CP1 may be between two adjacent gate lines GL, and the second conductive plug CP2 may be on one of the two adjacent gate lines GL.

The second conductive plug CP2 may include a second metal layer 140 and a second conductive barrier layer 142 extending along or covering a sidewall and a lower surface of the second metal layer 140. In some embodiments, the second metal layer 140 may include Co, W, Cu, Ru, Mn, Ti, Ta, or a combination thereof. The second conductive barrier layer 142 may include Ti, TiN, Ta, TaN, or a combination thereof.

In some embodiments, the second metal layer 140 may include the same conductive material as the first metal layer 130. The first metal layer 130 and the second metal layer 140 may include, for example, cobalt (Co). In some embodiments, the second metal layer 140 may include a material different from the first metal layer 130. For example, the first metal layer 130 may include cobalt (Co), and the second metal layer 140 may be include tungsten (W) or copper (Cu).

A stopper insulating layer 160 may cover the gate insulating capping layer 128 and the first insulating layer 170. The stopper insulating layer 160 may cover a portion of the first conductive plug CP1. In some embodiments, the stopper insulating layer 160 may cover a portion of the second conductive plug CP2. A second insulating layer 180 may be on the stopper insulating layer 160.

The integrated circuit device 100 may include a third conductive plug (or contact) CP3 connected to the first conductive plug CP1 and/or the second conductive plug CP2.

In some embodiments, the third conductive plug CP3 may form a second contact structure CS2 connected to the first contact structure CS1 including the first conductive plug CP1 and the second conductive plug CP2.

The third conductive plug CP3 may be in a third contact hole H3 and H3', which penetrates the second insulating layer 180 and the stopper insulating layer 160 and exposes the first conductive plug CP1 and/or the second conductive plug CP2. The third conductive plug CP3 may electrically connect the first conductive plug CP1 and/or the second conductive plug CP2 to a metal interconnection layer on the third conductive plug CP3.

The third conductive plug CP3 may electrically connect the first conductive plug CP1 and the second conductive plug CP2 to each other. For example, the third conductive plug CP3 may include a conductive material filling the third contact hole H3, which exposes the upper surface of the first conductive plug CP1 and the upper surface of the second conductive plug CP2 together. At least a portion of the third conductive plug CP3 may contact the first conductive plug CP1 and the second conductive plug CP2.

As shown in FIGS. 1 and 2A, the first conductive plug CP1 may be connected to at least one of the source/drain regions 120 between two adjacent gate lines GL. The second conductive plug CP2 may be connected to one of the two adjacent gate lines GL. The third conductive plug CP3 may be on the first conductive plug CP1 and the second conductive plug CP2, thereby forming a local interconnection for connecting the first and second conductive plugs CP1 and CP2. The third conductive plug CP3 may extend in the X direction and may at least partially overlap adjacent source/drain region 120 and gate line GL.

In some embodiments, the upper surface of the first conductive plug CP1 may be substantially coplanar with the second conductive plug CP2, such that the third conductive plug CP3 may have a substantially flat lower surface contacting the upper surfaces of the first and second conductive plugs CP1 and CP2. The lower surface of the third conductive plug CP3 may be substantially coplanar with a lower surface of the stopper insulating layer 160 around the third conductive plug CP3.

The third conductive plug CP3 may include a third metal layer 150 and a third conductive barrier layer 152 extending along or covering a sidewall and a lower surface of the third metal layer 150. In some embodiments, the third metal layer 150 may include Co, W, Cu, Ru, Mn, Ti, Ta, or a combination thereof. The third conductive barrier layer 152 may include, for example, Ti, TiN, Ta, TaN, or a combination thereof.

In some embodiments, the third metal layer 150 may include the same conductive material as the first metal layer 130. The first metal layer 130 and the third metal layer 150 may include, for example, Co. In some embodiments, the third metal layer 150 may include a different material from the first metal layer 130. For example, the first metal layer 130 may include Co and the third metal layer 150 may include W or Cu.

The stopper insulating layer 160 may include a material having an etch selectivity with respect to the second insulating layer 180. The stopper insulating layer 160 may act as an etch stopper layer while performing an etching process on the second insulating layer 180 to form the third contact hole H3 and H3' in which the third conductive plug CP3 is formed. The stopper insulating layer 160 may include, for example, silicon, nitride, carbide, or a combination thereof. For example, the stopper insulating layer 160 may include SiN, SiCN, SiC, SiCO, AlN, or a combination thereof. The stopper insulating layer 160 may cover a portion of a sidewall of the third conductive plug CP3.

Figure 3:
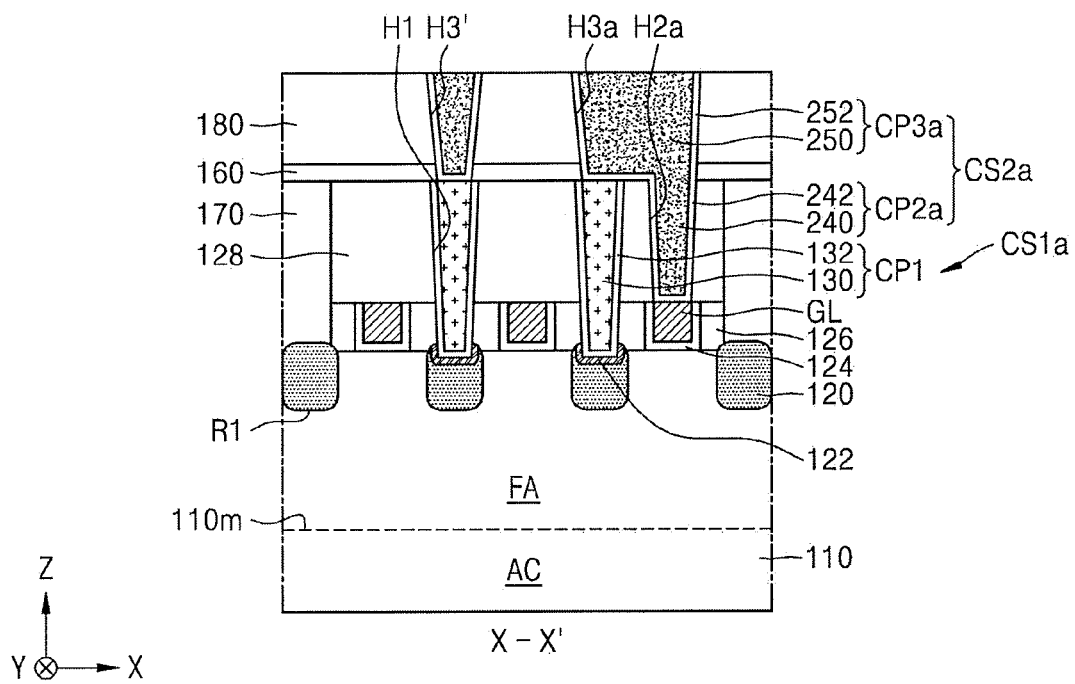
FIG. 3 illustrates another embodiment of an integrated circuit device.
Figure 4:
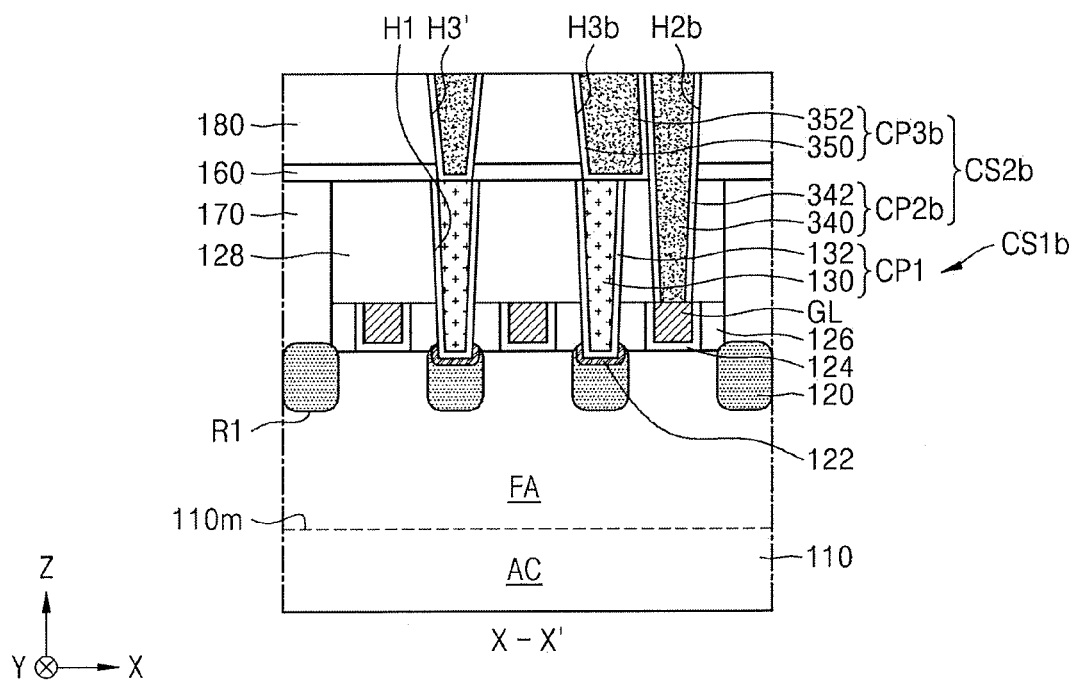
FIG. 4 illustrates another embodiment of an integrated circuit device.

FIG. 3 illustrates a cross-sectional view of another embodiment of an integrated circuit device 100a. FIG. 4 illustrates a cross-sectional view of another embodiment of an integrated circuit device 100b. FIGS. 3 and 4 are cross-sectional views taken along line X-X' in FIG. 1.

Referring to FIGS. 3 and 4, the integrated circuit devices 100a and 100b may include substantially the same elements as the integrated circuit device 100 in FIGS. 1, 2A, and 2B, except second conductive plugs CP2a and CP2b and third conductive plugs CP3a and CP3b.

In the integrated circuit device 100a of FIG. 3, the second conductive plug CP2a and the third conductive plug CP3a may be integrally formed. A second contact hole H2a in which the second conductive plug CP2a is formed and a third contact hole H3a in which the third conductive plug CP3a is formed may be formed to communicate with each other. Thus, the second conductive plug CP2a and the third conductive plug CP3a may be integrally formed by filling the second contact hole H2 and the third contact hole H3 with a conductive material.

In this case, a first contact structure CS1a may include a first conductive plug CP1, and a second contact structure CS2a may include the second conductive plug CP2a and the third conductive plug CP3a. The first contact structure CS1a may serve as a source/drain contact. The second contact structure CS2a may concurrently serve as a gate contact and a local interconnection structure connecting the gate contact and the source/drain contact In the integrated circuit device 100b of FIG. 4, a second conductive plug CP2b may upwardly extend beyond an upper surface of a first conductive plug CP1. The second conductive plug CP2b may have an upper surface higher than the upper surface of the first conductive plug CP1 relative to the main surface 110m of a substrate 110. The upper surface of the second conductive plug CP2B may be higher than an upper surface of the stopper insulating layer 160 relative to the main surface 110*m* of the substrate 110.

The second contact hole H2*b* may penetrate the second insulating layer 180, the stopper insulating layer 160, and the gate insulating capping layer 128 that are on the gate line GL. The second conductive plug CP2*b* may be formed by filling the second contact hole H2*b* with a conductive material. The third contact hole H3*b* may penetrate the second insulating layer 180 and the stopper insulating layer 160 to expose the upper surface of the first conductive plug CP1 and a sidewall of the second conductive plug CP2. The third conductive plug CP3*b* may be formed by filling the third contact hole H3*b* with a conductive material. A sidewall of the third conductive plug CP3*b* may contact the sidewall of the second conductive plug CP2*b*. A lower surface of the third conductive plug CP3*b* may contact the upper surface of the first conductive plug CP1.

In this case, the first contact structure CS1*b* may include the first conductive plug CP1 serving as the source/drain contact, the second contact structure CS2*b* may include the second conductive plug CP2*b* serving as the gate contact, and the third conductive plug CP3*b* serving as the local interconnection connecting the gate contact and the source/drain contact.

FIGS. 5A to 5G are cross-sectional views illustrating stages of an embodiment of a method for manufacturing an integrated circuit device. The method may be used to manufacture for example, the integrated circuit device 100 of FIGS. 1, 2A and 2B.

Figure 5A:
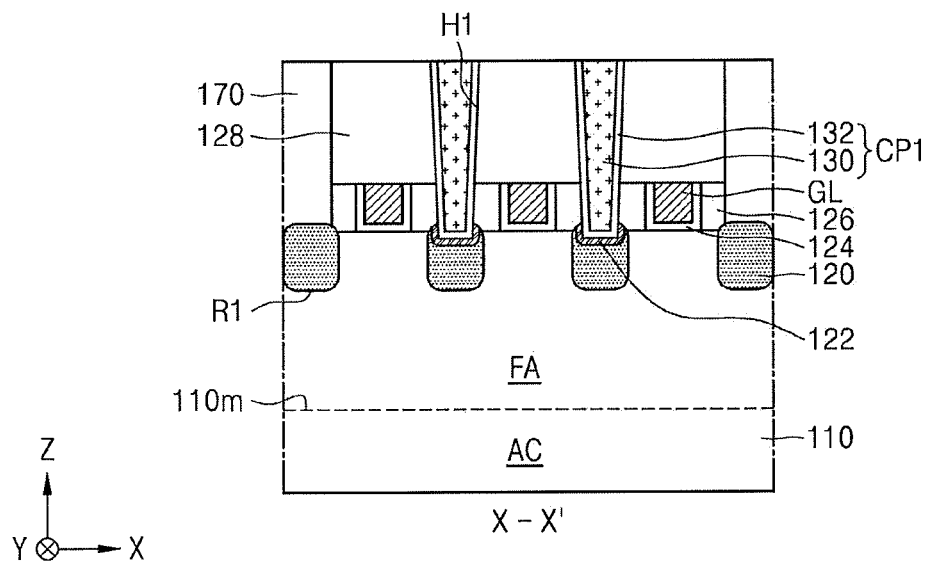
FIGS. 5A to 5G illustrate stages in an embodiment of a method for manufacturing an integrated circuit device.

Referring to FIG. 5A, a first conductive plug CP1 may be formed to be connected to each of source/drain regions 120 at opposite sides of a gate line GL. For example, after forming a first contact hole H1 penetrating a first insulating layer 170 to expose at least one of the source/drain regions 120 at the opposite sidewalls of the gate line GL, a first conductive barrier layer 132 may be formed in the first contact hole H1 and on the first insulating layer 170 and the gate insulating capping layer 128. Then, a first metal layer 130 may be formed on the first conductive barrier layer 132 to fill the first contact hole H1.

Thereafter, the above resulting structure may be planarized by a chemical mechanical polishing (CMP) process and/or an etch back process to expose an upper surface of the first insulating layer 170, an upper surface of the gate insulating capping layer 128, an upper surface of the first conductive barrier layer 132, and an upper surface of the first metal layer 130. Thus, the first metal layer 130 and the first conductive barrier layer 132 that fill the first contact hole H1 may form the first conductive plug CP1. In some embodiments, a metal silicide layer 122 may be formed between the first conductive plug CP1 and the at least one of the source/drain regions 120.

Figure 5B:
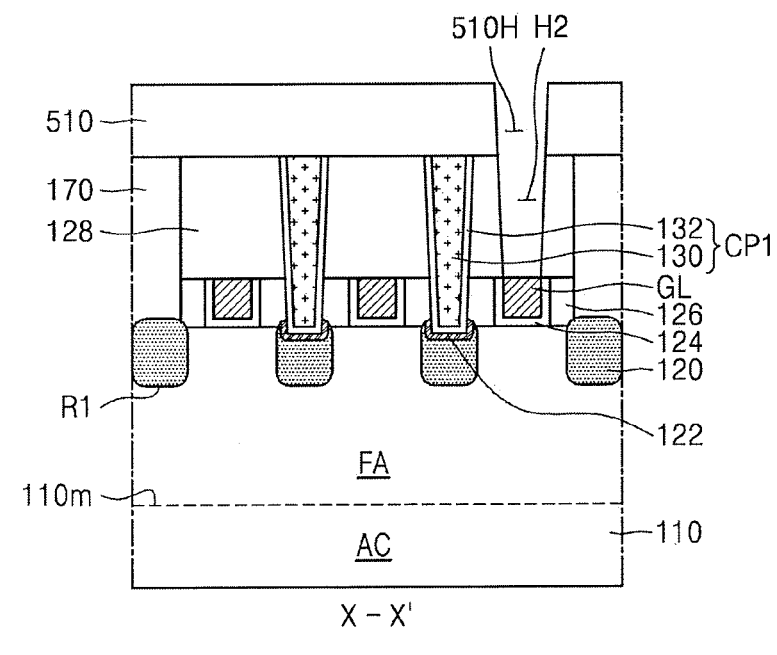

Referring to FIG. 5B, a hard mask pattern 510 including an opening 510H may be formed on the first insulating layer 170, the gate insulating capping layer 128, and the first conductive plug CP1. The opening 510H of the hard mask pattern 510 may expose a portion of the gate insulating capping layer 128 at a region in which a second conductive plug CP2 is to be formed Thereafter, the portion of the gate insulating capping layer 128 exposed by the opening 510H may be etched using the hard mask pattern 510 as an etch mask to form a second contact hole H2, which exposes an upper surface of the gate line GL adjacent the first conductive plug CP1.

Figure 5C:
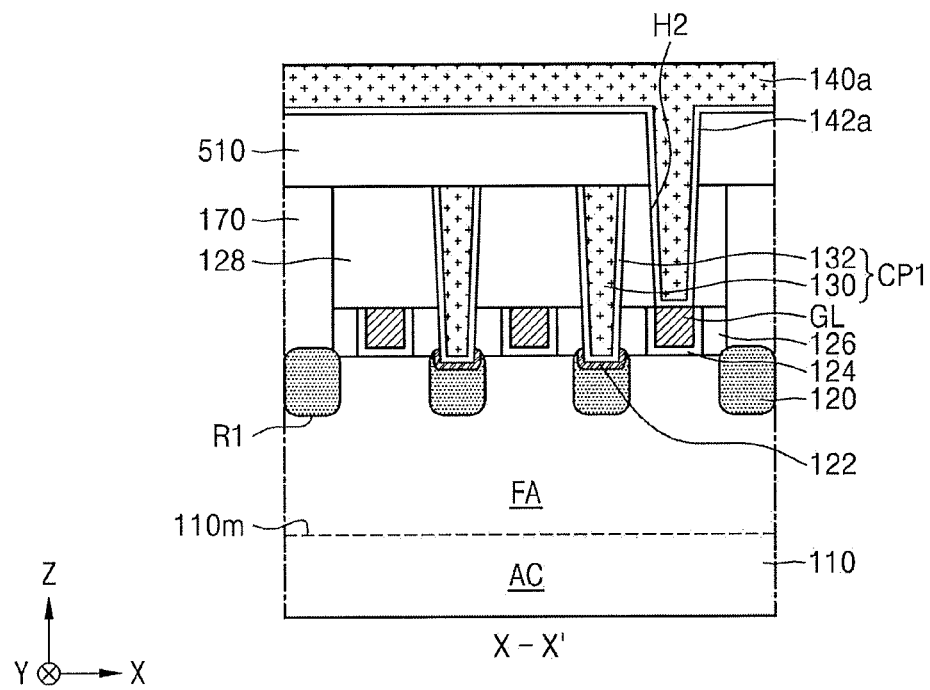

Referring to FIG. 5C, a second conductive barrier layer 142*a* may be formed in the second contact hole H2 and on an upper surface of the hard mask pattern 510. A second metal layer 140*a* may be formed on the second conductive barrier layer 142*a* to fill the second contact hole H2.

Figure 5D:
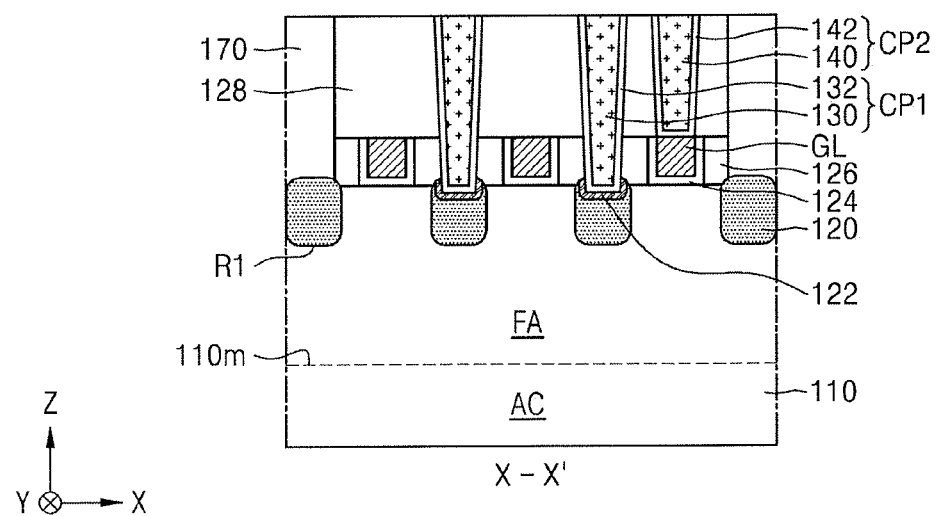

Referring to FIG. 5D, the resulting structure of FIG. 5C may be planarized, for example, by a CMP process to expose the upper surface of the first conductive plug CP1. Thus, the hard mask pattern 510 may be fully removed, and a portion of the second conductive barrier layer 142*a* of FIG. 5C and a portion of the second metal layer 140*a* of FIG. 5C may be removed, such that the second conductive barrier layer 142 and the second metal layer 140 that fill the second contact hole H2 may be formed to form the second conductive plug CP2.

The upper surface of the first conductive plug CP1 may be substantially coplanar with an upper surface of the second conductive plug CP2. The upper surfaces of the first and second conductive plugs CP1 and CP2 may be substantially coplanar with the upper surface of the gate insulating capping layer 128 therearound.

Figure 5E:
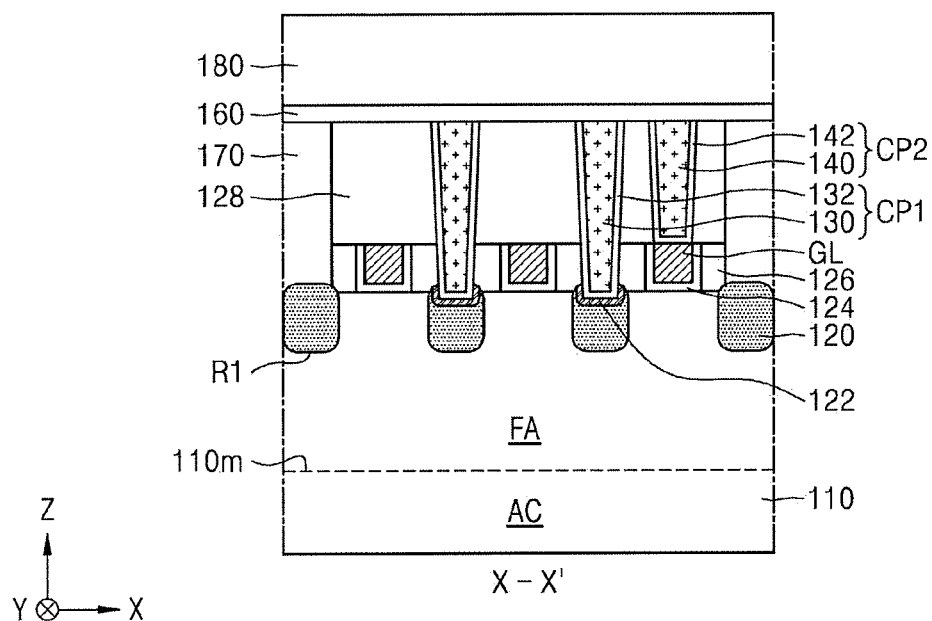

Referring to FIG. 5E, a stopper insulating layer 160 and a second insulating layer 180 may be sequentially formed on the first conductive plug CP1, the second conductive plug CP2, the gate insulating capping layer 128, and the first insulating layer 170.

Figure 5F:
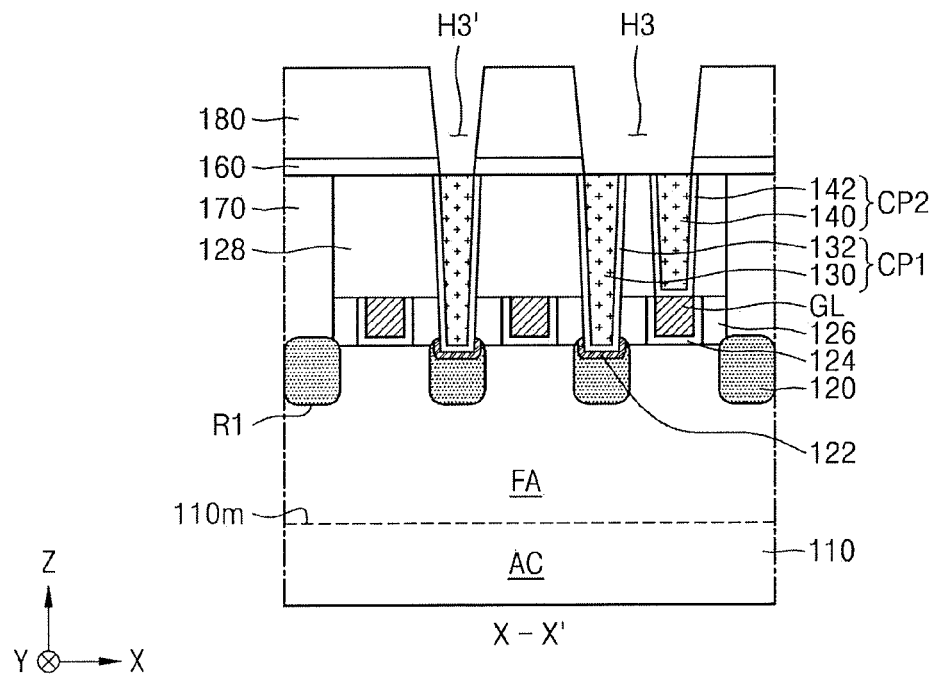

Referring to FIG. 5F, a third contact hole H3 and H3' may be formed to penetrate the second insulating layer 180 and the stopper insulating layer 160 and expose the first conductive plug CP1 and the second conductive plug CP2. For example, the third contact hole H3 and H3' may be formed, for example, by a photo-etching process. The stopper insulating layer 160 may be used as an etch stop layer in the etching process for forming the third contact hole H3 and H3'. A portion of the second insulating layer 180 may be etched using the stopper insulating layer 160 as the etch stop layer. Then, a portion of the stopper insulating layer 160 may be removed to expose the upper surface of the first conductive plug CP1 and the upper surface of the second conductive plug CP2.

In a region in which a third conductive plug CP3 for connecting the first and second conductive plugs CP1 and CP2 is to be formed, the third contact hole H3 may expose the upper surface of the first conductive plug CP1 and the upper surface of the second conductive plug CP2 together.

At least a portion of the third contact hole H3 that exposes the upper surface of the first conductive plug CP1 and the upper surface of the second conductive plug CP2 together may have a substantially flat lower surface. A level at the upper surface of the first conductive plug CP1 and a level at the upper surface of the second conductive plug CP2 may respectively substantially the same relative to a main surface 110*m* of a substrate 110, before and after forming the third contact hole H3. The third contact hole H3 may extend to a depth corresponding to the level of the upper surfaces of the first conductive plug CP1 and the upper surface of the second conductive plug CP2.

In the etching process for forming the third contact hole H3, the first conductive plug CP1 and/or the second conductive plug CP2 may be prevented from being undesirably etched or consumed. Thus, while forming the local interconnection structure connecting the first and second conductive plugs CP1 and CP2 using the third conductive plug CP3, loss of or damage to a conductive material forming the first metal layer 130 and/or the second metal layer 140 may be reduced or prevented.

Figure 5G:
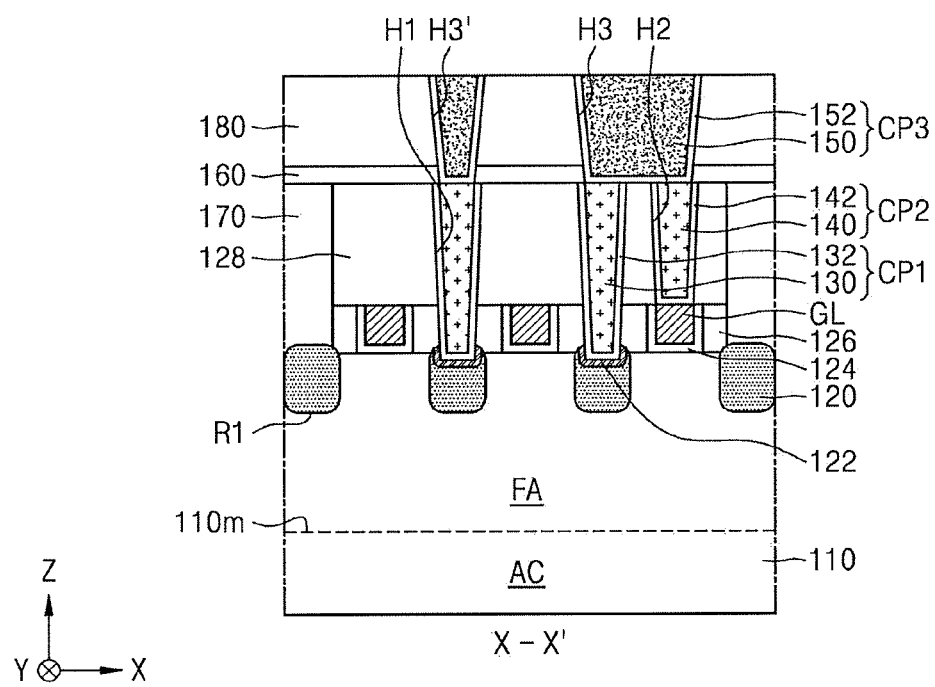

Referring to FIG. 5G, the third conductive plug CP3 may be formed to fill the third contact hole H3 and H3'. For example, a third conductive barrier layer 152 may be formed in the third contact hole H3 and H3' and on the second insulating layer 180. A third metal layer 150 may be formed on the third conductive barrier layer 152 to fill the third contact hole H3 and H3'. Thereafter, the resulting structure may be planarized, for example, by the CMP process to expose the upper surface of the second insulating layer 180, an upper surface of the third conductive barrier layer 152, and an upper surface of the third metal layer 150. The third conductive barrier layer 152 and the third metal layer 150 that fill the third contact hole H3 and H3' may form the third conductive plug CP3. The third conductive plug CP3 in the third contact hole H3 may connect the first conductive plug CP1 to the second conductive plug CP2.

In the integrated circuit device and the method of manufacturing the same according to the example embodiments, the source/drain contact connected to the source/drain region 120 and the gate contact connected to the gate line GL may be prevented from being damaged during the process of manufacturing the integrated circuit device 100. Thus, contact resistance between the source/drain and gate contacts and the interconnection structure for connecting the source/drain contact and the gate contact may be decreased.

FIGS. 6A to 6D are cross-sectional views illustrating stages of another embodiment of a method for manufacturing an integrated circuit device according to example embodiments. This method may be used to manufacture, for example, the integrated circuit device 100*a* of FIG. 3.

Figure 6A:
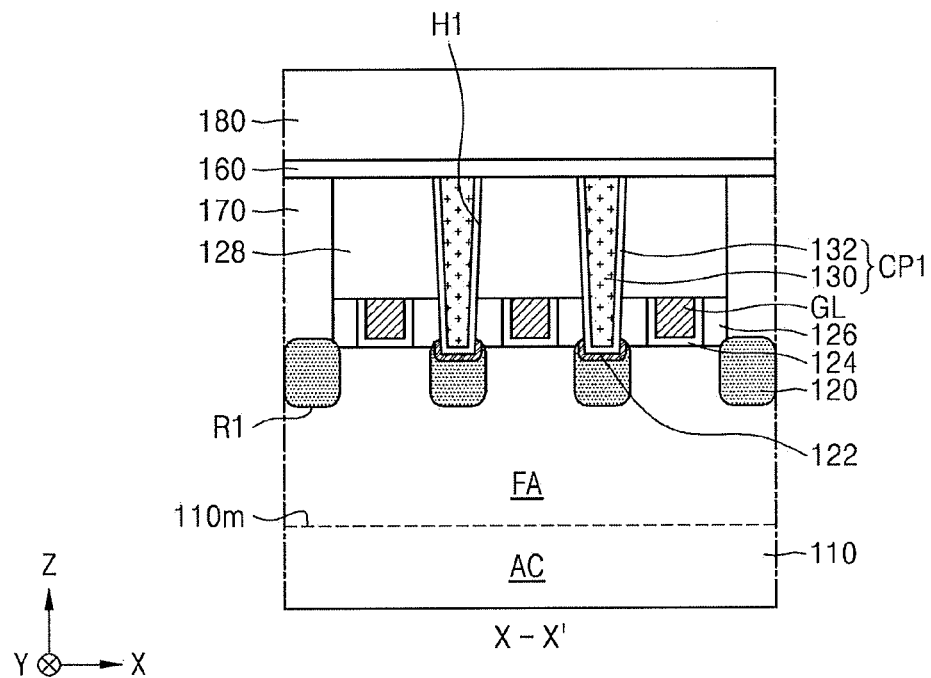
FIGS. 6A to 6D illustrate stages in another embodiment of a method for manufacturing an integrated circuit device.
Figure 6B:
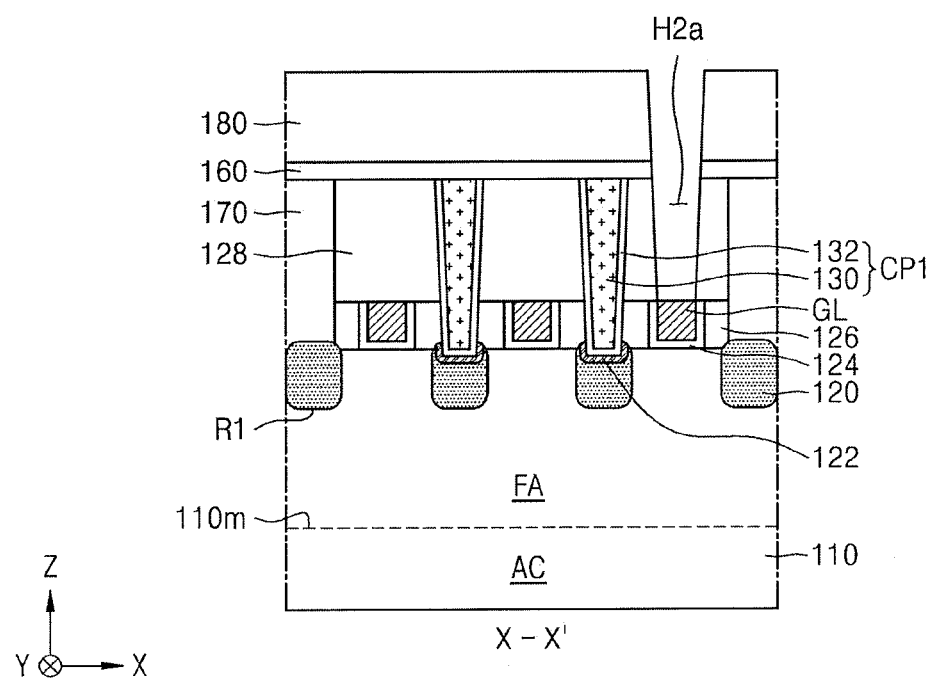

Referring to FIG. 6A, a stopper insulating layer 160 and the second insulating layer 180 may be sequentially formed on the first conductive plug CP1, the gate insulating capping layer 128, and the first insulating layer 170 in the resulting structure of FIG. 5A Referring to FIG. 6B, a second contact hole H2*a* may be formed to expose an upper surface of the gate line GL. The second contact hole H2*a* may be formed by removing a portion of the gate insulating capping layer 128, a portion of the stopper insulating layer 160, and a portion of the second insulating layer 180 that are on the gate line GL.

Figure 6C:
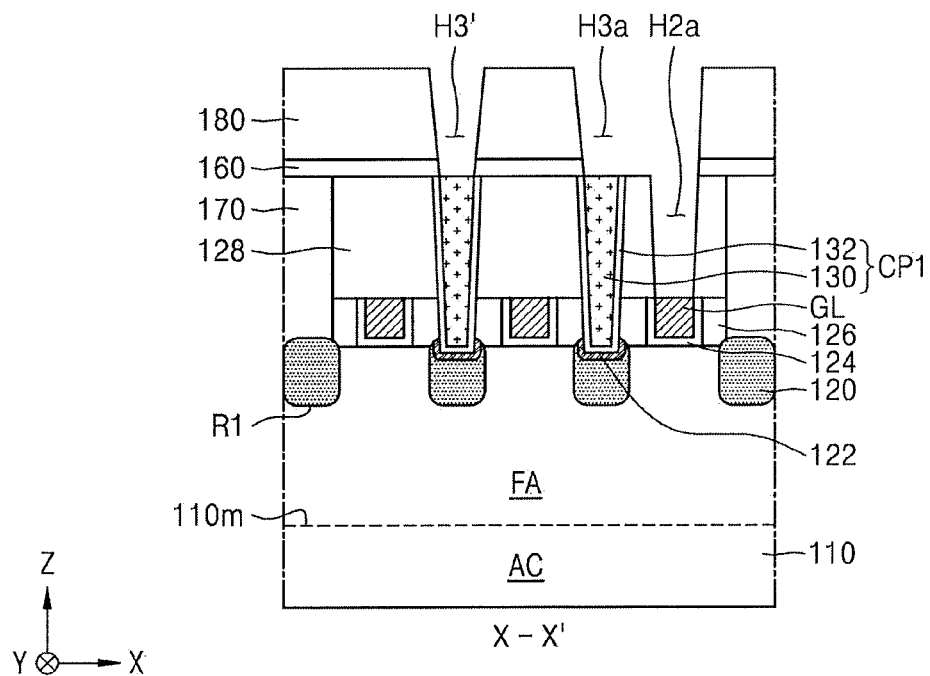

Referring to FIG. 6C, a third contact hole H3*a* and H3' penetrating the second insulating layer 180 and the stopper insulating layer 160 may be formed to expose an upper surface of the first conductive plug CP1. The third contact hole H3*a* may be formed to communicate with the second contact hole H2*a*. The stopper insulating layer 160 may be used as an etch stopper layer during the etching process for forming the third contact hole H3'. The third contact hole H3*a* and H3' may be formed to extend to a depth corresponding to the upper surface of the first conductive plug CP1. Thus, loss of or damage to a conductive material forming the first conductive plug CP1 may be reduced or prevented during the etching process for forming the third contact hole H3*a* and H3'.

In some embodiments, the second contact hole H2*a* and the third contact hole H3*a* and H3' may be formed in a different process from those in FIGS. 6B and 6C. For example, in the resulting structure of FIG. 6A, a portion of the second insulating layer 180 on the first conductive plug CP1 and a portion of the second insulating layer 180 on the gate line GL may be removed, a portion of the stopper insulating layer 160 and a portion of the gate insulating capping layer 128 may be removed to expose the upper surface of the gate line GL, and a portion of the stopper insulating layer 160 may be removed to expose the upper surface of the first conductive plug CP1, to thereby form the second contact hole H2*a* and the third contact hole H3*a* and H3'.

Figure 6D:
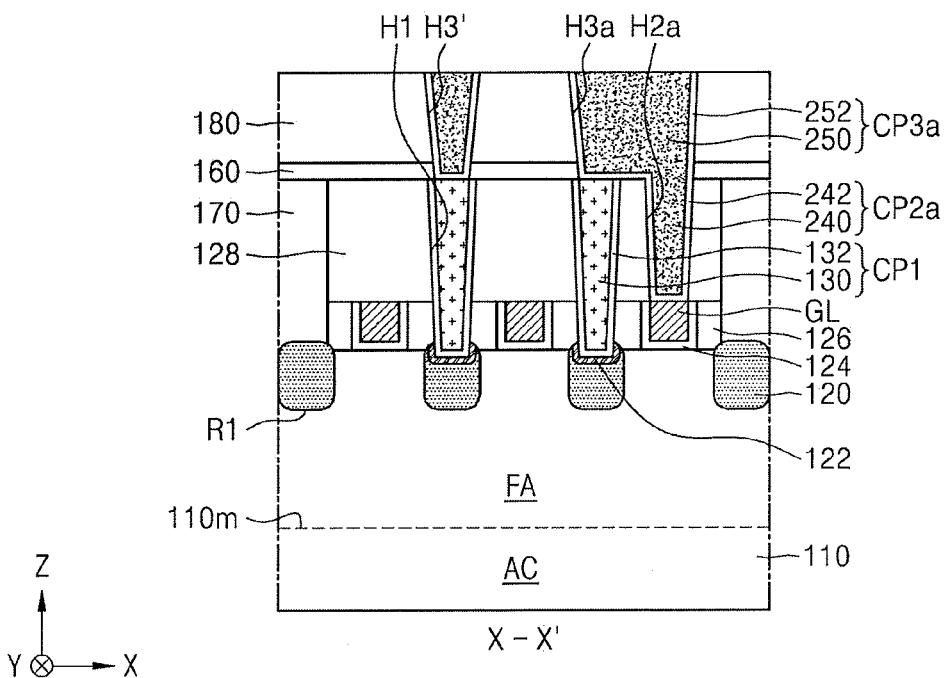

Referring to FIG. 6D, the second contact hole H2*a* and the third contact hole H3*a* and H3' may be filled with a conductive material, such that a second conductive plug CP2*a* and a third conductive plug CP3*a* may be formed. In the communicating second contact hole H2*a* and third contact hole H3*a*, the second conductive plug CP2*a* and the third conductive plug CP3*a* may be integrally formed. For example, a second conductive barrier layer 242 and a third conductive barrier layer 252 may be integrally formed on a surface of the second insulating layer 180, a surface of the stopper insulating layer 160, a surface of the gate insulating capping layer 128, and the upper surface of the gate line GL that are exposed by the second contact hole H2*a* and the third contact hole H3*a*. A second metal layer 240 and a third meal layer 250 may be integrally formed on the integrally formed second and third conductive barrier layers 242 and 252 to fill the second contact hole H2*a* and the third contact hole H3*a*.

Figure 7A:
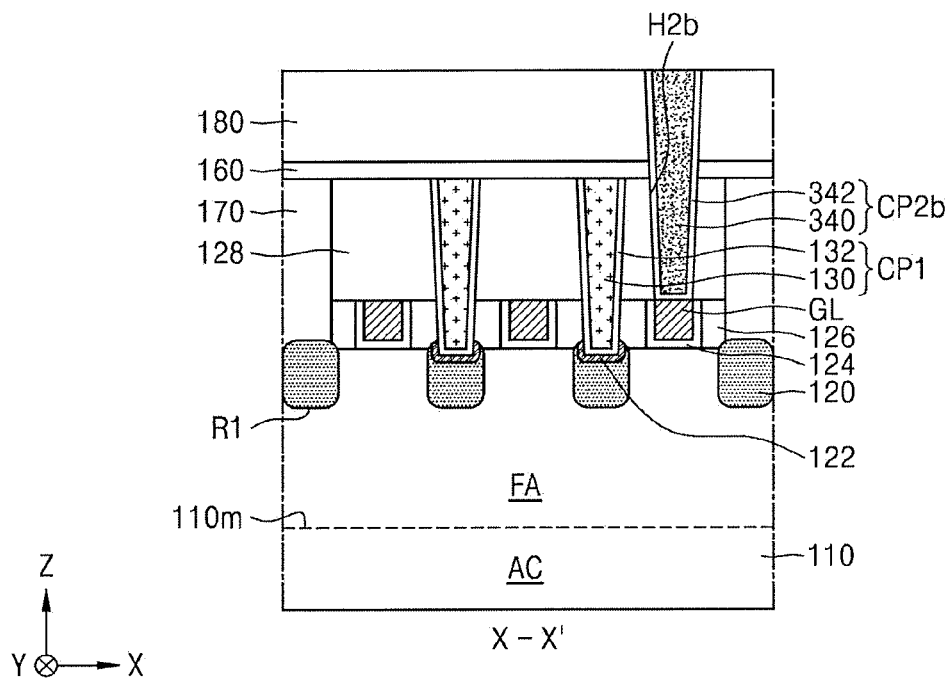
FIGS. 7A and 7B illustrate stages in another embodiment of a method for manufacturing an integrated circuit device.
Figure 7B:
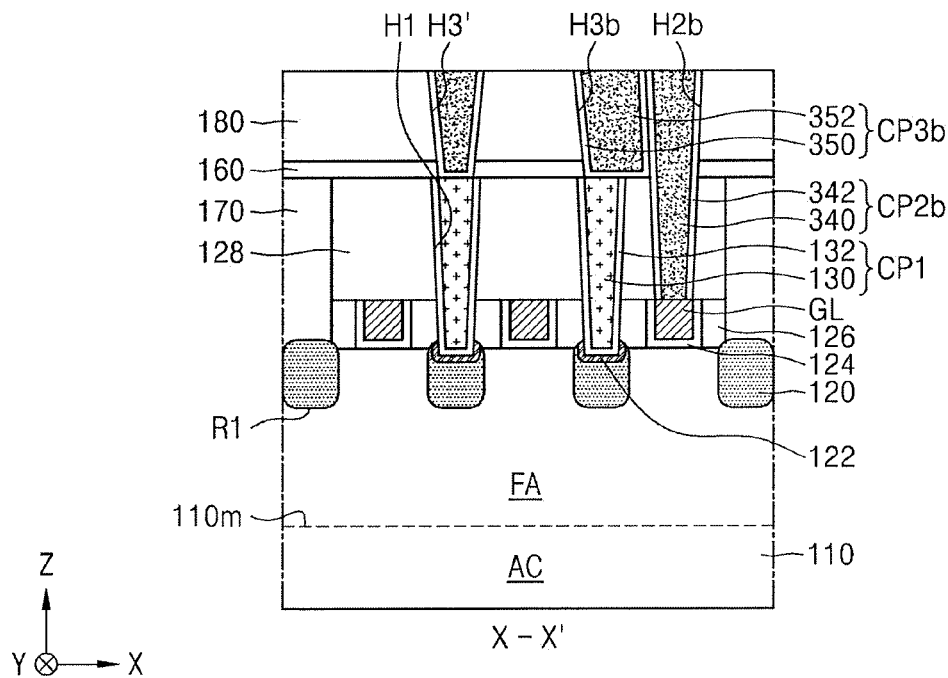

FIGS. 7A and 7B are cross-sectional views illustrating stages of another embodiment of a method for manufacturing an integrated circuit device. This method may be used to manufacture the integrated circuit device 100*b* of FIG. 4.

Referring to FIG. 7A, a structure similar to the resulting structure of FIG. 6B may be formed on a substrate 110. Then, a second contact hole H2*b* may be filled with a conductive material to form a second conductive plug CP2*b*. For example, a second conductive barrier layer 342 may be formed on a surface of the second insulating layer 180, a surface of the stopper insulating layer 160, a surface of the gate insulating capping layer 128, and an upper surface of the gate line GL that are exposed by the second contact hole H2*b*. A second metal layer 340 may be formed on the second conductive barrier layer 342 to fill the second contact hole H2*b*.

Referring to FIG. 7B, a third contact hole H3*b* and H3' penetrating the second insulating layer 180 and the stopper insulating layer 160 may be formed to expose an upper surface of the first conductive plug CP1. A sidewall of the second conductive plug CP2*b* may be exposed by the third contact hole H3*b*. The third contact hole H3*b* and H3' may be formed to extend to a depth corresponding to an upper surface of a first conductive plug CP1. Thus, loss of or damage to a conductive material configuring the first conductive plug CP1 may be reduced or prevented.

Thereafter, the third contact hole H3*b* and H3' may be filled with a conductive material to form a third conductive plug CP3*b*. For example, to form the third conductive plug CP3*b* in the third contact hole H3*b*, a third conductive barrier layer 352 may be formed on a surface of the second insulating layer 180, a surface of the stopper insulating layer 160, a surface of the first conductive plug CP1, and a surface of the second conductive plug CP2*b* that are exposed by the third contact hole H3*b*. A third meal layer 350 may be formed on the third conductive barrier layer 352 to fill the third contact hole H3*b*.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. An integrated circuit device, comprising:
a substrate including at least one fin-type active region extending in a first direction;
a gate line on the at least one fin-type active region and extending in a second direction crossing the first direction;
a source/drain region on the at least one fin-type active region at at least one side of the gate line;
a first conductive plug connected to the source/drain region;
a second conductive plug connected to the gate line, the second conductive plug spaced apart from the first conductive plug;
a third conductive plug connected to each of the first conductive plug and the second conductive plug, the third conductive plug electrically connecting the first conductive plug and the second conductive plug;
a gate insulating capping layer on the gate line, the gate insulating capping layer covering a sidewall of the first conductive plug and a sidewall of the second conductive plug; and
a stopper insulating layer on the gate insulating capping layer, the stopper insulating layer covering a portion of the third conductive plug, wherein
an upper surface of the first conductive plug is substantially coplanar with an upper surface of the second conductive plug.

2. The integrated circuit device as claimed in claim 1, wherein the third conductive plug has a substantially flat lower surface contacting the upper surface of the first conductive plug and the upper surface of the second conductive plug.

3. The integrated circuit device as claimed in claim 1, wherein
the gate insulating capping layer has an upper surface substantially coplanar with the upper surface of the first conductive plug and the upper surface of the second conductive plug.

4. The integrated circuit device as claimed in claim 1, wherein the first conductive plug includes a metal layer including cobalt and a conductive barrier layer covering a sidewall and a lower surface of the metal layer.

5. The integrated circuit device as claimed in claim 1, wherein the second conductive plug and the third conductive plug have integral structure.

6. An integrated circuit device, comprising:
a substrate including at least one fin-type active region extending in a first direction;
a gate line on the at least one fin-type active region and extending in a second direction crossing the first direction;
a source/drain region on the at least one fin-type active region at at least one side of the gate line;
a first conductive plug connected to the source/drain region;
a second conductive plug connected to the gate line, the second conductive plug spaced apart from the first conductive plug; and
a third conductive plug connected to each of the first conductive plug and the second conductive plug, the third conductive plug electrically connecting the first conductive plug and the second conductive plug, wherein:
an upper surface of the second conductive plug is higher than an upper surface of the first conductive plug relative to a main surface of the substrate, and
a sidewall of the second conductive plug contacts a sidewall of the third conductive plug.

7. The integrated circuit device as claimed in claim 1, wherein:
the at least one fin-type active region includes a plurality of fin-type active regions parallel to one another, and
the first conductive plug extends across the plurality of fin-type active regions.

8. The integrated circuit device as claimed in claim 1, wherein:
the first conductive plug and the second conductive plug are respectively on the source/drain region and the gate line that are adjacent in the first direction, and
the third conductive plug extends in the first direction and at least partially overlaps the source/drain region and the gate line.

9. An integrated circuit device, comprising:
a substrate including at least one fin-type active region;
a plurality of gate lines extending across the at least one fin-type active region;
a plurality of source/drain regions on the at least one fin-type active region at opposite sides of the plurality of gate lines;
a first contact structure including a first conductive plug connected to at least one of the plurality of source/drain regions between adjacent ones of the plurality of gate lines and a second conductive plug connected to one of the adjacent ones of the plurality of gate lines; and
a second contact structure on the first contact structure and including a third conductive plug on an upper surface of the first conductive plug and on an upper surface of the second conductive plug to connect the first conductive plug and the second conductive plug.

10. The integrated circuit device as claimed in claim 9, wherein the first conductive plug is spaced apart from the second conductive plug.

11. The integrated circuit device as claimed in claim 9, wherein:
the first conductive plug includes a first metal layer and a first conductive barrier layer covering a sidewall of a lower surface of the first metal layer, the first metal layer including a first conductive material,
the second conductive plug includes a second metal layer and a second conductive barrier layer covering a sidewall of a lower surface of the second metal layer, the second metal layer including a second conductive material, and
an upper surface of the first metal layer is substantially coplanar with an upper surface of the second metal layer.

12. The integrated circuit device as claimed in claim 11, wherein at least one of the first conductive material and the second conductive material include cobalt.

13. The integrated circuit device as claimed in claim 9, further comprising:
a gate insulating capping layer on each of the plurality of gate lines, the gate insulating capping layer covering a sidewall of the first conductive plug and a sidewall of the second conductive plug; and
a stopping insulating layer on the gate insulating capping layer, the stopping insulating layer covering a portion of the third conductive plug.

14. The integrated circuit device as claimed in claim 1, wherein the first conductive plug includes cobalt.

15. The integrated circuit device as claimed in claim 6, wherein the first conductive plug includes cobalt.

\* \* \* \* \*